US010460589B1

(12) United States Patent
Srinivasan (10) Patent No.: US 10,460,589 B1
(45) Date of Patent: Oct. 29, 2019

(54) CABLE TRAY LOAD ASSESSMENT AND/OR MONITORING

(71) Applicant: Amazon Technologies, Inc., Seattle, WA (US)

(72) Inventor: Nikhilesh Srinivasan, Herndon, VA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/142,769

(22) Filed: Sep. 26, 2018

(51) Int. Cl.
| | |
|---|---|
| *G08B 21/18* | (2006.01) |
| *H02G 7/00* | (2006.01) |
| *H02G 3/04* | (2006.01) |
| *G01G 3/14* | (2006.01) |
| *G01G 19/52* | (2006.01) |
| *H05K 7/14* | (2006.01) |
| *H05K 7/20* | (2006.01) |

(52) U.S. Cl.
CPC ............ *G08B 21/182* (2013.01); *G01G 3/14* (2013.01); *G01G 19/52* (2013.01); *H02G 3/0456* (2013.01); *H02G 7/00* (2013.01); *H05K 7/1498* (2013.01); *H05K 7/20745* (2013.01)

(58) Field of Classification Search
CPC ........ G08B 21/182; G01G 3/14; G01G 19/52; H02G 3/0456; H02G 7/00; H05K 7/1498; H05K 7/20745
USPC ........................................................ 340/666
See application file for complete search history.

(56) References Cited

U.S. PATENT DOCUMENTS

| | | | | |
|---|---|---|---|---|
| 10,176,454 | B2* | 1/2019 | Jones ..................... | G06F 16/10 |
| 2005/0171854 | A1* | 8/2005 | Lyon .................. | G01G 19/4144 |
| | | | | 705/24 |
| 2008/0302033 | A1* | 12/2008 | Insalaco ................... | B66C 7/04 |
| | | | | 52/220.2 |
| 2012/0125028 | A1* | 5/2012 | Keisling ............ | H05K 7/20827 |
| | | | | 62/228.1 |
| 2012/0182151 | A1* | 7/2012 | Tong .................... | H05K 7/1498 |
| | | | | 340/666 |
| 2014/0298734 | A1* | 10/2014 | Rogers .................... | E04B 1/343 |
| | | | | 52/79.9 |
| 2015/0256394 | A1* | 9/2015 | Palmer .................... | H04L 12/10 |
| | | | | 709/221 |
| 2016/0048798 | A1* | 2/2016 | Meyer ................. | G06Q 10/087 |
| | | | | 705/28 |
| 2017/0000277 | A1* | 1/2017 | Johnson ............. | A47G 25/1407 |
| 2017/0260028 | A1* | 9/2017 | Verheyen ............... | B66C 13/16 |
| 2018/0189722 | A1* | 7/2018 | Aepli .................. | G01B 11/002 |
| 2018/0195894 | A1* | 7/2018 | Salter ..................... | G01G 23/32 |
| 2018/0271281 | A1* | 9/2018 | Bryan ...................... | A47F 3/06 |
| 2018/0365642 | A1* | 12/2018 | Bonner ............. | G06Q 10/0836 |

* cited by examiner

*Primary Examiner* — Jack K Wang
(74) *Attorney, Agent, or Firm* — Kilpatrick Townsend & Stockton LLP

(57) ABSTRACT

A cable tray may be mounted so as to be spaced above a floor that supports one or more racks of servers and/or other datacenter components. The cable tray may support cables connected to the datacenter components of the one or more racks. A sensor may provide a reading about a load exerted by the cables on the cable tray. An indicator may indicate a status of the cable tray in response to the reading from the sensor.

20 Claims, 6 Drawing Sheets

CABLE TRAY LOAD ASSESSMENT AND/OR MONITORING

BACKGROUND

Overhead cable trays are often included in datacenters as a support structure to accommodate a large number of cables used for interconnecting servers and/or other devices for computing networks. Frequently, the cable trays are suspended by rods extending downward from the ceiling, which allows cables to be routed overhead and clear of walkways and other spaces that a technician may use to access electronic datacenter component racks (e.g., server racks) and other floor-supported structures. While useful in this regard, such cable trays can sometimes be overloaded with cables.

BRIEF DESCRIPTION OF THE DRAWINGS

Various embodiments in accordance with the present disclosure will be described with reference to the drawings, in which.

DETAILED DESCRIPTION

Embodiments herein relate to infrastructure and components for identifying and indicating load within overhead cable trays. Cable trays (within a datacenter, for example) can be equipped with components that can sense, detect, or otherwise determine a weight or other load exerted by cables upon respective cable trays or sections of the trays. For example, load-cells may be situated along a tray's inner surface that receives the cables, or rods that support the trays may be outfitted with strain-gauges, scales, or other elements capable of determining elongation, deflection, and/or load asserted on the rods by the cables present in the tray. Dials, gauges, lights, screens, or other indicators can output such information in a manner that can be readily viewed by technicians, for example so that technicians may know whether adding additional cable to a respective tray is a suitable action to take. Such indicators may provide a technician at-a-glance information about whether a cable tray is already approaching a maximum weight capacity or whether additional capacity is available to add additional cables. Such information may be useful, for example, because the weight capacity of the tray may differ from the space capacity in the tray. In other words, although a technician may see that a tray appears to have space in which more cables could be fit, the tray may nevertheless be at or near its weight capacity, which the technician might not realize apart from the provision of the indicators to elucidate this status.

In some embodiments, control systems may allow a user or other technician to modify parameters of the system, such as capacity limits, thresholds, or other details relating to how the indicators reflect information from the sensors. In some embodiments, information about the load within cable trays may be useful for allowing additional planning of laying out cable within the datacenter.

Ready access to information about the load within cable trays may also lead to a reduction or elimination of certain costs. For example, cable tray load information may be utilized to provide warnings or otherwise avoid or reduce costs that may otherwise arise if it becomes necessary to conduct repairs associated with overloading a cable tray to the point of collapse. Additionally, implementing systems to automatically obtain and respond to such cable tray load information may reduce labor costs associated with otherwise employing personnel to visually inspect and analyze or re-analyze a cable tray's capacity usage in each instance out of a likely vast number of times that cabling may be added or changed during maintenance, replacement, or re-configuration of elements during the useful life of a datacenter.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Reference will now be made to the Figures, in which like reference numerals refer to like elements throughout the Figures. In many instances, similar elements may be identified by the same reference numeral and differentiated by a different letter suffix in the Figures. Thus in the following text description, elements may be referenced with suffixes (e.g., for referencing individual or specific elements such as an upper cable tray 50B or a lower cable tray 50C) or without suffixes (e.g., for generally or collectively referencing elements such as one or more of the cable trays 50).

Figure 1:
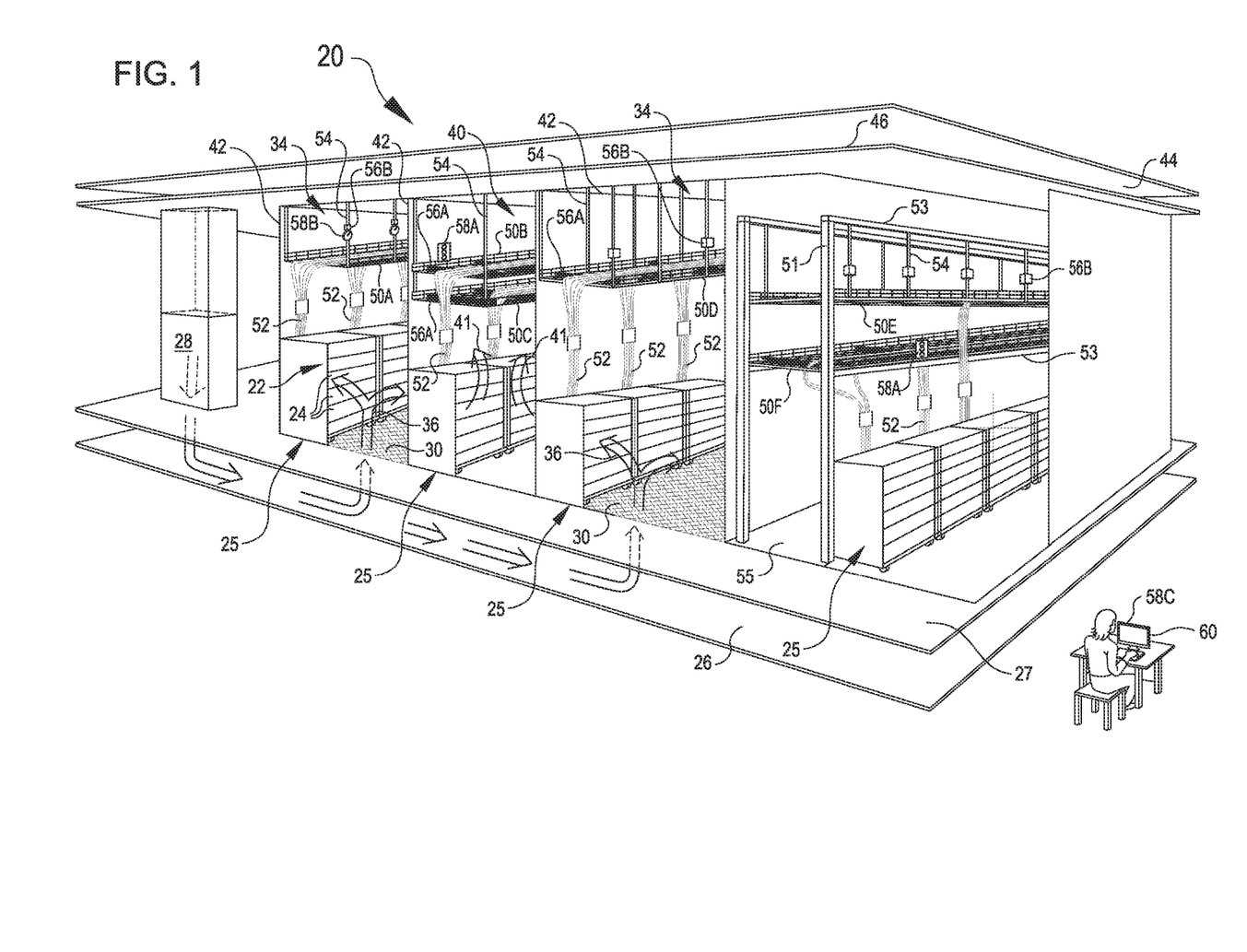
FIG. 1 illustrates a datacenter incorporating systems for assessing and/or monitoring cable tray load in accordance with various embodiments.

FIG. 1 shows a datacenter 20 in accordance with embodiments. The datacenter 20 includes electronic datacenter component racks 22 (hereinafter "rack" or "racks") having electronic datacenter components 24 mounted therein. Although the electronic datacenter components 24 are diagrammatically shown as rectangles in the drawings, the electronic datacenter components may fill only portions of the rack, as is known. As examples, the electronic datacenter components 24 may include any suitable form of electronic components, including, but not limited to, servers, network switches, routers, power supplies, other forms of network hardware equipment, and any other components that might be used in a datacenter.

The datacenter 20 is depicted with the racks 22 defining respective rows 25 corresponding to the space occupied by the electronic datacenter component racks 22 when installed and/or the space designated for receiving the electronic datacenter component racks 22 for installation. The rows 25 may abut and/or define respective hot aisles 40 and cold aisles 34 that facilitate a cooling flow through the datacenter 20. One illustrative and non-limiting example of the cooling flow is depicted in FIG. 1, although other cooling flows and corresponding components and arrangements are also possible.

By way of example, the cooling flow shown in FIG. 1 originates with a cold air supply 28, which may be, for example, chillers, air conditioning, outside air venting, computer room air handling units, and/or other cool air supply of an environmental control system. The cold air supply 28 is shown located at a periphery of a room of the datacenter 20, as is typical to allow as much space as possible in a climate-controlled space to be used for electronic datacenter components 24. In the cooling flow depicted in FIG. 1, cold air from the cold air supply 28 flows beneath the floor 27 in a cold air plenum 26, up through vents 30 in the floor 27 into a cold aisle 34, and into the racks 22 (e.g., as depicted by arrow 36). This flow may be aided and/or at least partially provided, for example, by fans that pull cool air across the electronic datacenter components 24 in the racks 22. Heat generated by the electronic datacenter components 24 may be carried by passage of air through the racks 22, for example, the air may enter as cool air from the cold aisle 34 and exhaust as heated air into the hot aisle 40 (e.g., as depicted by arrow 41). The resulting warmer air may be isolated in the hot aisles 40 from the cold aisles 34 by walls, curtains, or other air containment structures 42 and directed (e.g., by natural convection currents and/or active airflow devices) through suitable vents, ducting, or other structures into a hot air plenum 44 in or above the ceiling 46 of the datacenter 20.

The ceiling 46 of the datacenter 20 is also shown supporting cable trays 50 in FIG. 1. More generally, the cable trays 50 may be located in any suitable location to facilitate receiving cables 52 from the electronic datacenter components 24 in the racks 22. In various embodiments, the cable trays 50 may be positioned above the respective racks 22. For example, the trays 50 may be at least partially over a row 25, a hot aisle 40, a cold aisle 34 and/or other areas (such as walking paths 55) of the datacenter.

In some embodiments, the cable trays 50 may be suspended from the ceiling 47. For example, rods 54 may be mounted in the ceiling 46 and extend downward to support the cable trays 50. In some embodiments, the cable trays 50 may be supported from the floor 27. For example, columns 51 may extend up from the floor 27 and may support the cable trays 50 directly and/or via cross-beams 53 that are in turn supported by the columns 53. The beams 53 may support the cable trays 50 from below (e.g., as with the cable tray 50F in FIG. 1), or the beams 53 may support the cable trays 50 from above, such as by suspending the cable trays via rods 54 (e.g., as with cable tray 50E in FIG. 1). In some embodiments, cable trays 50 may be supported relative to a portion of the floor 27 that does not include vents 30, such as depicted at right in FIG. 1, e.g., which may correspond to an area subject to a cooling flow introduced through the ceiling 46 or other source other than the floor 27. However, as noted above, the cooling flow depicted in FIG. 1 is merely for illustrative purposes, and more generally, cable trays 50 and other related structures described herein can be utilized regardless of whatever cooling flow is implemented in the datacenter 20.

In use, the cable trays 50 may support cables 52 and route the cables 52 up and out of space which technicians may access adjacent to the racks 22. The trays 50 may be any suitable shape for supporting and routing the cables 52. For example, although the trays 50 in FIG. 1 are generally depicted as having sidewalls extending from a bottom to form a channel in which the cables 52 can be arranged and maintained, the trays 50 may be provided with different sidewalls or without sidewalls. More generally, the trays 50 may correspond to any suitable shelf or ledge. Suitable materials may include but are not limited to metal, plastic, fiberglass, or other sturdy materials. The trays 50 may be substantially flat or varied in surface contours. The trays 50 may be wireframe or otherwise include a series of openings that allow passage of cables 52 through the trays at suitable locations.

The trays 50 may be arranged in any suitable configuration. In some embodiments (such as depicted in the leftward cold aisle 34 and rightward cold aisle 34 in FIG. 1), a single tray 50 may be arranged over a particular area of the datacenter 20. In some embodiments (such as depicted in the hot aisle 40 depicted in the center FIG. 1), multiple trays 50 may be arranged over a particular area of the datacenter 20. Multiple trays 50 may be supported by a shared set of rods 54. For example, as shown in the hot aisle 40 depicted in the middle of FIG. 1, an upper tray 50B and a lower tray 50C are supported by the same set of rods 54.

The datacenter 20 also includes sensors 56. The sensors 56 in FIG. 1 are individually identified with suffixes such as sensor 56A and sensor 56B. The sensors 56 may provide information about a weight or other load exerted on the cable trays 50 by cables 52 that are supported by the cable trays 50. The sensors 56 can include any suitable structure for accomplishing this function. Some suitable examples are described in greater detail with respect to FIGS. 2-4 below. Any number of sensors 56 can be used on a particular tray 50. In some embodiments, a single sensor 56 may be utilized to provide information about a set of trays 50 that are supported together.

The datacenter 20 can also include one or more indicators 58. The indicators 58 in FIG. 1 are identified with suffixes such as 58A, 58B, and 58C. The indicators 58 can provide a perceptible indication of information about the status of trays 50 based upon information provided by the respective sensors 56. As non-limiting examples, the indicators 58 may display a total weight of an amount of cables 52 on a given tray 50 or set of trays 50, or a total load exerted on the ceiling 46 and/or roof that is supporting an assembly that includes the trays 50, cables 52, and rods 54. The indicators 58 may additionally or alternatively show a status relative to a capacity limit of a tray 50 and/or associated structure supporting the tray 50 such as a rod 54 or ceiling 46. For example, the indicators 58 may indicate a percentage, fraction, or other portion that has been consumed relative to a total capacity limit or other relevant reference amount.

Non-limiting examples of components that may be utilized by indicators 58 shown in FIG. 1 are a light array (e.g., indicator 58A), a dial or a gauge (e.g., indicator 58B), and a screen (e.g., indicator 58C). Some examples of suitable indicators 58 are described in greater detail with respect to subsequent figures.

The datacenter 20 can further include a control system 60. The control system 60 may include computer components and/or other components suitable for facilitating communication between respective components of the datacenter 20. For example, the control system 60 may allow a user to input parameters and adjust operation of the sensors 56 and/or indicators 58, for example, adjusting parameters and/or other thresholds and how those thresholds will affect indicators 58 that are in communication with sensors 56.

In some examples, an indicator 58 may be present adjacent or at a tray 50 for which the indicator 58 provides a status. For example, above the cold aisle 34 depicted at left in FIG. 1, a rod-based sensor 56B and an indicator 58B are positioned adjacent a tray 50A and provide information about a status of the tray 50A (e.g., via a dial that a technician can consult). Similarly, the indicator 58A shown above the hot aisle 40 in FIG. 1 may indicate a status of one or more adjacent cable trays 50, such as the upper cable tray 50B and the lower cable tray 50C (e.g., via a light array that the technician can check). The indicator 58A in FIG. 1 thus may correspond to an example of an indicator 58 that indicates a status of a set of trays 50 rather than a single tray 50, e.g., based on input from one or more sensors 56A.

In some examples, an indicator 58 may be remote from a tray 50 for which the indicator 58 provides a status. For example, above the cold aisle 34 depicted at right in FIG. 1, a tray 50D is shown outfitted with similar sensors 56A and 56B as in other trays 50A, 50B, and 50C. However, it may be noted that tray 50D does not include indicators 58A and 58D as with the other depicted trays 50A, 50B, and 50C. Rather, a status of the tray 50D may instead be output by an indicator 58C (e.g., a screen) remote from the tray 50D. The tray 50D thus illustrates by way of example that a tray may be solely associated with a remote indicator 58. Moreover, although other trays 50A, 50B, and 50C in FIG. 1 are shown with local indicators 58, in some embodiments, a respective tray 50 may be associated with both local and remote indicators, e.g., which may permit a technician to readily monitor or plan for a large number of trays 50 from a remote location and yet also be able to check the status of a tray 50 when physically present near that tray 50.

Figure 2:
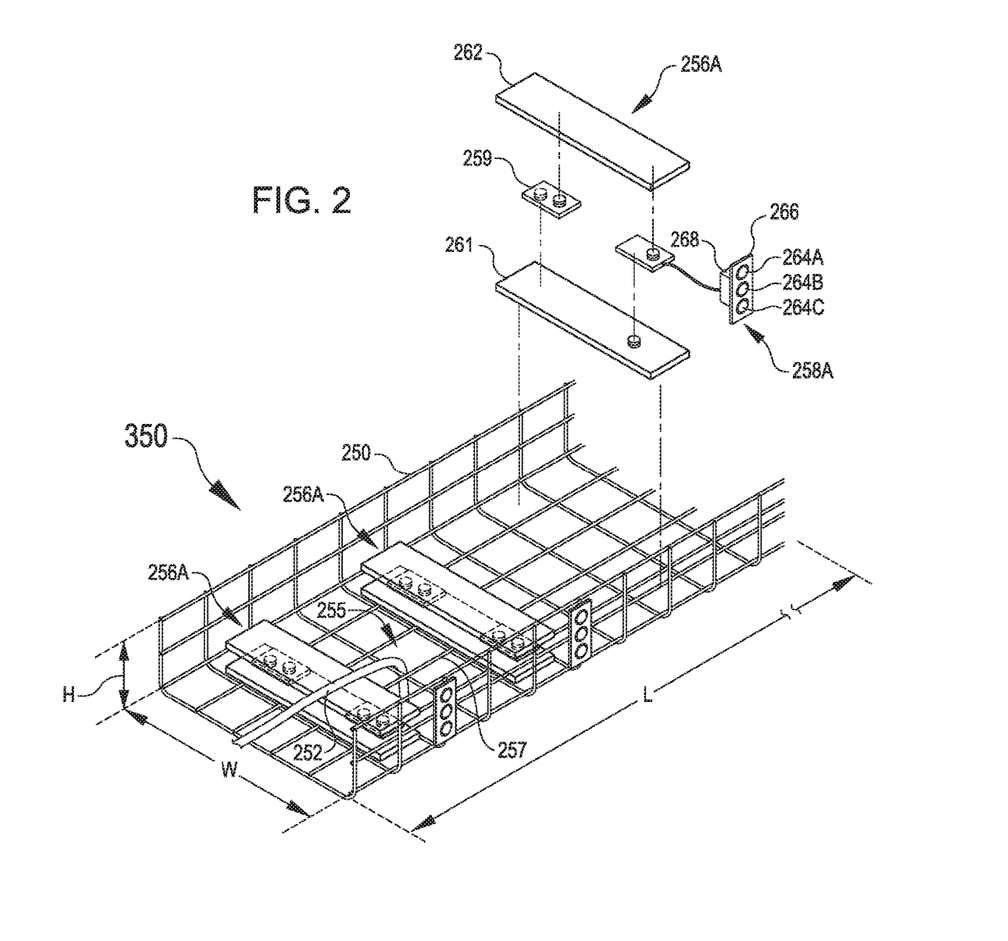
FIG. 2 illustrates an example of load cell sensors and indicator light assemblies that may be utilized individually or in combination in the datacenter of FIG. 1 in accordance with various embodiments.

FIG. 2 illustrates a portion of a tray 250 outfitted with sensors 256A and indicators 258A. The tray 250, sensors 256A, and indicators 258A may be examples of like elements from FIG. 1 (e.g., such as those associated with the tray 50B in FIG. 1).

The tray 250 in FIG. 2 defines a length L, a width W, and a height H. For example, these dimensions may correspond to a channel bounded by sides and a bottom of the tray 250. The tray 250 is shown formed of wires 257 that define openings 255 through which cables 252 can be routed to exit the tray 250. Openings 255 additionally or alternatively may be defined by any other suitable structure for forming the tray 250. In some embodiments, the openings 255 may be omitted or otherwise obviated, such as if cables 252 are routed over respective walls defined by the tray 250 in addition to or in lieu of routing through the respective walls defined by the tray 250.

The tray 250 in FIG. 2 is shown having a series of identical sensors 256A, although different types of sensors could additionally or alternatively be used as desired in some embodiments. The sensors 256A may be spread out along the length L of the tray 250. A spread out arrangement may permit information to be provided about respective statuses relative to different segments of the tray 250. As an illustrative example, a cable 252 in FIG. 2 is shown overlaying a first instance of the sensor 256A (e.g., shown toward the left of FIG. 2) and then routed down through an opening 255 in the tray 250 without also overlaying a second instance of the sensor 256A (e.g., shown near a middle of FIG. 2). Accordingly, the first instance of the sensor 256A may reflect the weight of the overlaying cable 252, while the second instance of the sensor 256A may reflect a different status based on lacking any load exerted on it by the cable 252.

The sensor 256A shown in FIG. 2 is sized and arranged to be inserted into and/or to engage a bottom of a channel defined by the tray 250. The sensors 256A may span across the width W of the tray. Spanning the width W may allow the sensor 256A to read a weight exerted by a cable 252 regardless of where in the height H of the tray 250 that the cable 252 is ultimately positioned.

As may be best seen at the right of FIG. 2, the sensor 256A can include a load cell 259. The load cell 259 may be situated between a base plate 261 and a cover plate 262, for example. The base plate 261 may engage a bottom of a channel defined by the tray 250. The cover plate 262 may be sized to receive one or more cables 252 and transfer a weight of the cable(s) 252 to the load cell 259. In operation, a load exerted on the cover plate 262 may press down on the load cell 259 and cause a member within the load cell 259 to deflect or otherwise undergo a change of state that is convertible to an output signal indicative of the magnitude of the load exerted on the load cell 259. In some embodiments, the load cell 259 may correspond to a commercially available component.

The sensor 256A is shown in each instance in FIG. 2 coupled with a respective light-based indicator 258A, although the sensor 256A could additionally or alternatively be utilized with a different form of indicator. The light-based indicator 258A is shown having a light array 266. Although the light array 266 is shown with three lights 264A, 264B, and 264C, any suitable number of lights 264 may be utilized, including one, two, three, or more than three.

In an illustrative example, the first light 264A may illuminate red or another color in response to a detected load exceeding a capacity limit set for the corresponding portion of the tray 250. For example, the first light 264A illuminating may indicate to a technician that no further cables 252 should be added to the tray 250, that some amount of cable 252 should be removed from the tray 250, and/or that additional reinforcement or other capacity modification should be provided for the tray 250.

Continuing in this illustrative example, the second light 264B may illuminate yellow, orange, or another color in response to the detected load being within a certain threshold amount of the capacity limit set for the tray 250. The second light 264B illuminating may indicate to a technician that a limited amount of cables 252 may still be added to the tray 250. For example, the second light 264B may illuminate in response to the load detected by the sensor 256A coming within 15% or other predetermined threshold amount of the capacity limit for the tray 250 stored in memory. In some embodiments, the threshold amount at which the second light 264B illuminates and/or the capacity limit at which the first light 264A illuminates may be adjustable by a control system such as the control system 60 in FIG. 1.

Continuing in this illustrative example, the third light 264C may illuminate green, blue, or another color in response to the detected load being less than either the warning threshold or the capacity limit set for the cable tray 250 or set of cable trays 250. The third light 264C illuminating may indicate to a technician that it is safe to continue to add further cables 252 to the tray 250.

The light-based indicator 258A in FIG. 2 is also shown having an electronics package 268. The electronics package 268 may include any suitable electronics for facilitating communication with the sensor 256A (or any other suitable form of sensor) and/or other system components. In some embodiments, the electronics package 268 additionally or alternatively may include a suitable controller or other component of a control system for receiving data from a sensor (such as the sensor 256A) and/or analyzing such data to determine an appropriate response for the indicator 258A.

Figure 3:
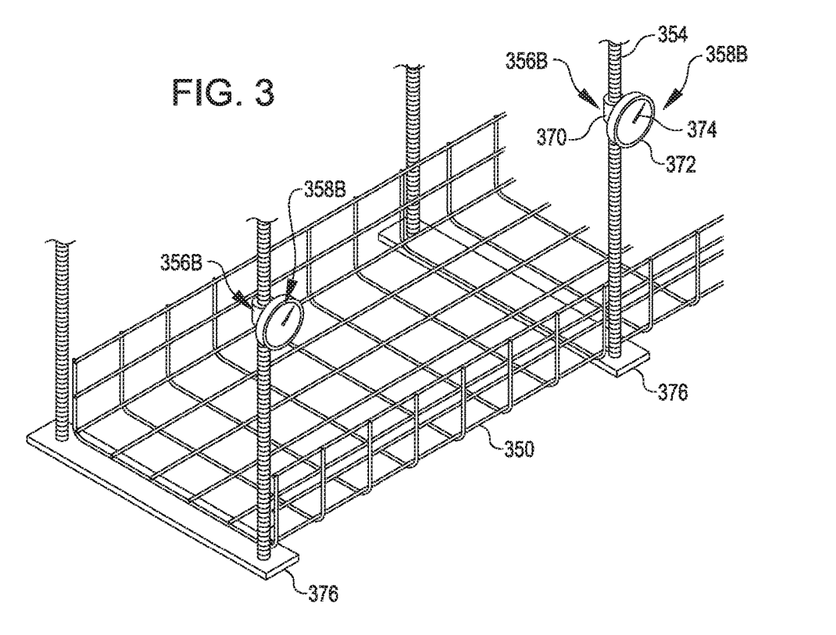
FIG. 3 illustrates an example of rod-based sensors and indicators that may be utilized individually or in combination in the datacenter of FIG. 1 in accordance with various embodiments.

FIG. 3 illustrates a portion of a tray 350 outfitted with sensors 356B and indicators 358B. The tray 350, sensors 356B, and indicators 358B may be examples of like elements from FIG. 1 (e.g., such as those associated with the tray 50A in FIG. 1).

The tray 350 in FIG. 3 is supported by a set of one or more rods 354. A suitable subset of the rods 354 can be outfitted with rod-based sensors 356B. In some embodiments, a sensor 356B is included on a rod 354 on one side of the tray 350 (e.g., on a right side in FIG. 3) and not included on a rod 354 on an opposite side of the tray 350 (e.g., on a left side in FIG. 3). For example, including a rod-based sensor 356B on one side but not an opposite side of the tray 350 may reduce a number of inputs to account for in computations relating to loads exerted on the tray 350 and associated support structure such as the rods 354. In addition, limiting the number of sensors limits the costs of purchase, installation, and maintenance of sensors. However, without a sensor on each rod, variance may need to be taken into account for uneven distribution which may or may not be capable of being sensed.

The sensor 356B shown in FIG. 3 include a segment 370. The segment 370 may be coupled to a single portion of a rod 354 or may be an intervening section in between two portions of the rod 354. In some embodiments, the portions of the rods 354 depicted in FIG. 3 above the segment 370 may correspond to portions that are received within the ceiling (e.g., the ceiling 46 of FIG. 1). Hence, although the sensor 356B is described as rod-based herein, in some embodiments, this may correspond to the sensor 356B being positioned at an end of the rod 354, for example, being coupled with the ceiling and providing an intervening structure between an end of the rod 354 and a structure that mounts or couples to or through the ceiling.

The segment 370 is shown as functional block that may correspond to suitable structure for providing an output that can be utilized to enable the function of the sensor 356B. As a non-limiting example, the segment 370 may include a strain gauge. For example, a strain gauge may provide an output about strain experienced in the rod 354 in a manner that may be correlated to a load exerted on the rod 354 by any cables present in the tray 350 supported by the rod 354. Additionally or alternatively, the segment 370 may include a scale. For example, a scale may permit a direct output of weight to be determined based on the load exerted on the rod 354 via the tray 350 by the cables received in the tray 350. Additionally or alternatively, the segment 370 may include a gauge that indicates elongation or deflection of the rod 354 that can be correlated to a load exerted on the rod 354.

The segment 370 may include suitable structure for communicating to a respective indicator. For example, the rod-based sensor 356B in FIG. 3 is shown including or otherwise associated with an indicator 358B, although the rod-based sensor 356B could additionally or alternatively be utilized with a different form of indicator. The indicator 358B in FIG. 3 includes a dial 372. The dial 372 has a needle 374 that can rotate to different radial positions to show different forms of status such as a total weight, or a ratio of utilized capacity relative to a predetermined capacity limit. For example, the dial may rotate among markings that indicate numerical values (e.g., such as a weight) or among different zones that may be marked by different colors or other visual differentiation (e.g., a red zone indicating a limit is exceeded, an orange zone indicating the limit is within a certain threshold of being reached, or a green zone indicating additional cabling can safely be added). In some aspects, the dial 372 may include knobs or other physical manually adjustable features to allow the dial to be the calibrated according to the weight parameters and capacity limit anticipated for the arrangement of rods 354 and associated support structure. In some embodiments, the rod-based sensor 356B and indicator 358B may correspond to an assembly that may be fully analog and capable of providing status information without digital components. Additionally or alternatively, at least some part of the assembly may include components that may be controlled and/or communicated with digitally.

The segment 370 may additionally or alternatively include components of a control system. For example, the segment 370 may include a controller or other suitable processing component for analyzing input from a sensor and generating corresponding output to cause an associated indicator to respond accordingly.

Figure 4:
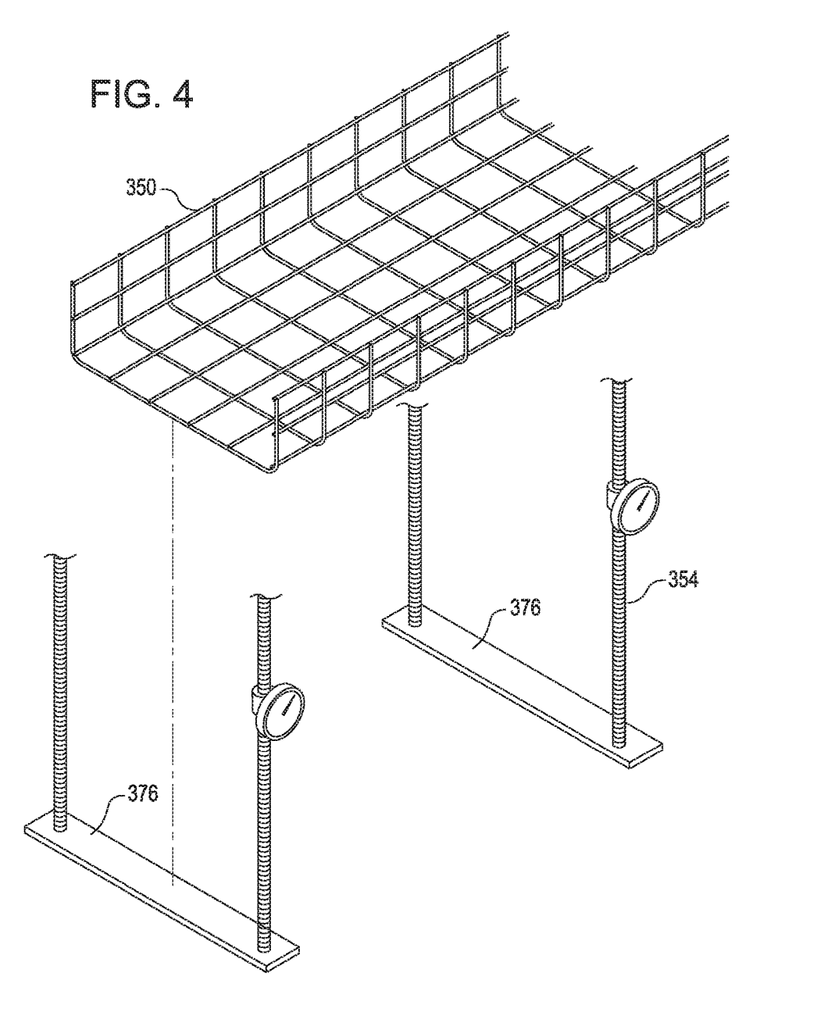
FIG. 4 illustrates an exploded assembly view of elements from FIG. 3 in accordance with various embodiments.

FIG. 4 illustrates an exploded view of components from FIG. 3. FIG. 4 depicts an example of an interface by which the rods 354 may support the tray 350. In FIG. 4, the rods 354 are coupled with brackets 376 that support an underside of the tray 350 relative to the rods 354. Other coupling of the tray 350 to the rods 354 are also possible, including but not limited to directly attaching the rods 354 to the tray 350 by welding, adhesives, hardware, or other joining techniques.

Figure 5:
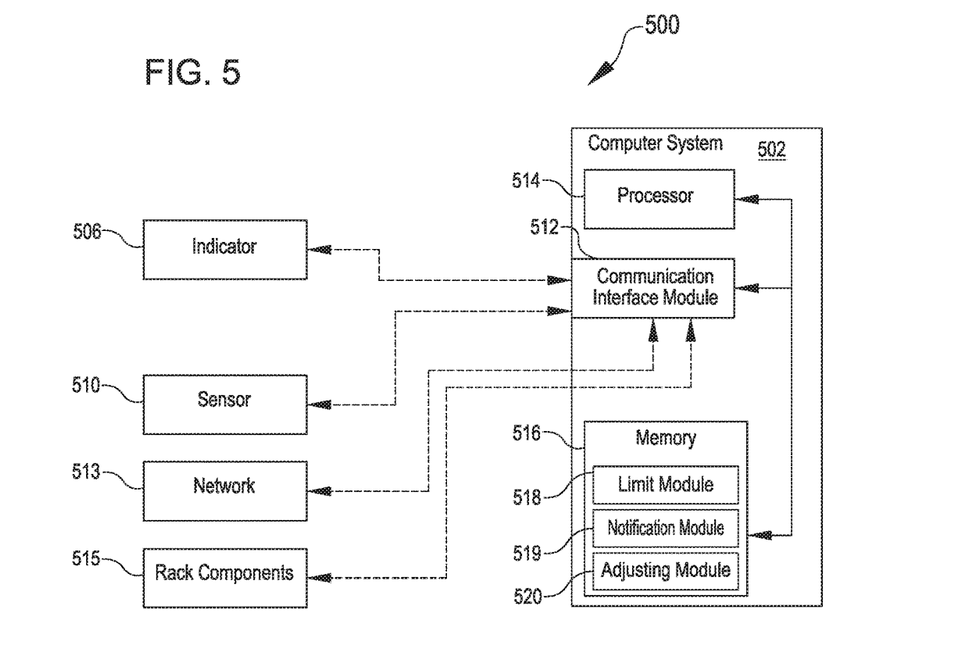
FIG. 5 is a block diagram illustrating components of a system that may be utilized in the datacenter of FIG. 1 in accordance with various embodiments.

FIG. 5 illustrates an example of a system 500 that may be utilized in embodiments herein. The system 500 is depicted as including an indicator 506, a sensor 510, a network 513, rack components 515, and a computer system 502. In general, the computer system 502 may function as a controller that controls other components of the system 500, for example, as described further below. However, although various examples will be described below in which the computer system 502 facilitates functionality of the overall system 500, it is also to be understood that the computer system 502 is not necessarily required for such functionality of the overall system 500, and in some embodiments, components of the overall system 500 may provide comparable functions with at least partially analog, non-computerized, and/or mechanical components or otherwise in the absence of the computer system 502. However, for clarity, various examples will also be described below with respect to the computer system 502.

The indicator 506 can include any suitable structure for outputting a status of a tray. For example, the indicator 506 may correspond to any indicator described herein. As further non-limiting examples, the indicator 506 may include components for providing email or other remote messages regarding a status of elements of the system 500. The sensor 510 can include any suitable structure for obtaining information relating to a status of a tray. For example, the sensor 510 may correspond to any sensor described herein. The network 513 may provide communication between the computer system 502 and other components, such as other computer systems or sources of data or input. The rack components 515 may correspond to electronic datacenter components 24 such as servers or other elements that may have relevant information for the system 500. For example, the rack components 515 may provide relevant information about whether cables have been unplugged during actions taken to adjust routing of the cables through various trays. Generally, the indicator 506, sensor 510, network 513, and rack components 515 may function as appropriate inputs and/or outputs for control of the overall system 500 by the computer system 502.

The illustrated computer system 502 includes a communication interface module 512, a processor 514, a memory 516, a limit module 518, a notification module 519, and an adjusting module 520. The computer system 502 may represent a single component, multiple components located at a central location within the overall system 500, or multiple components distributed throughout the overall system 500. For example, distributed arrangements may allow a single technician and/or computer to monitor trays throughout a single datacenter and/or across multiple datacenters. In general, computer system 502 may include any appropriate combination of hardware and/or software suitable to provide the described functionality.

Processor 514 is operable to execute instructions associated with the functionality provided by computer system 502. Processor 514 may comprise one or more general purpose computers, dedicated microprocessors, or other processing devices capable of communicating electronic information. Examples of processor 514 include one or more application-specific integrated circuits (ASICs), field programmable gate arrays (FPGAs), digital signal processors (DSPs) and any other suitable specific or general purpose processors.

Memory 516 stores processor instructions, state information for the various components of the overall system 500, and/or any other appropriate values, parameters, or information utilized by computer system 502 during operation. Memory 516 may represent any collection and arrangement of volatile or nonvolatile, local or remote devices suitable for storing data. Examples of memory 516 include, but are not limited to, random access memory (RAM) devices, read only memory (ROM) devices, magnetic storage devices, optical storage devices or any other suitable data storage devices.

Communication interface module 512 facilitates communication between computer system 502 and other components of the overall system 500, including information and/or instructions conveyed between any of the indicator 506, the sensor 510, the network 513, the rack components 515, limit module 518, notification module 519, and adjusting module 520. These communications may represent communication of any form appropriate based on the capabilities of computer system 502 and may include any suitable information. Depending on the configuration of computer system 502, communication interface module 512 may be responsible for facilitating either or both of wired and wireless communication between computer system 502 and the various components of overall system 500. In particular embodiments, computer system 502 may communicate using communication protocols such as ethernet, 802.11, Bluetooth, or Infrared Data Association (IrDA) standards.

In general, the limit module 518, the notification module 519, the adjusting module 520, and the communication interface module 512 may each represent any appropriate hardware and/or software suitable to provide the described functionality. In addition, as noted above, computer system 502 may, in particular embodiments, represent multiple different discrete components and any or all of the limit module 518, the notification module 519, the adjusting module 520, and the communication interface module 512 may represent components physically separate from the remaining elements of computer system 502. Moreover, any two or more of the limit module 518, the notification module 519, the adjusting module 520, and the communication interface module 512 may share common components. For example, in particular embodiments, the limit module 518, the notification module 519, and the adjusting module 520 represent computer processes executing on processor 514 and communication interface module 512 comprises a wireless transmitter, a wireless receiver, and a related computer process executing on processor 514.

The limit module 518 can determine suitable limits for trays and/or associated infrastructure. For example, the limit module 518 may determine an appropriate threshold limit or capacity limit for a given set of infrastructure, e.g., based on weight and/or strength of respective components such as trays 50, rods 54, ceilings 46, etc. In some embodiments, such limits may be manually entered or determined based on other available information.

The notification module 519 can provide notifications about a status of one or more respective trays. For example, the notification module 519 may trigger or control actions by the indicators 58 based on input received from sensors 56 and in comparison to limits determined by the limit module 518 for respective trays 50.

The adjusting module 520 can adjust parameters for the notification module 519 and/or limit module 518. For example, in some embodiments, the adjusting module 520 may adjust parameters of the limit module 518 to reflect a change to components physically present in the datacenter 20 and therefore a change in structure and strength and capacity of a particular arrangement. Additionally or alternatively, the adjusting module 520 may adjust a setting of the notification module 519, such as a frequency at which to send notifications or parameters around when a notification is generated or when a change to an indicator is triggered. As an illustrative example, the adjusting module 520 may adjust a capacity limit stored by the limit module 518 upward from an initial value of 8 kilograms to an adjusted value of 10 kilograms, e.g., so that the notification module 519 will cause the indicator 258A to illuminate a first warning light 264A in red or another color only if a detected weight exceeds 10 kilograms rather than at the earlier limit of 8 kilograms. As another illustrative example, the adjusting module 520 may adjust a threshold amount stored by the limit module 518 from 20% to 10%, e.g., so that the notification module 519 will cause the indicator 258A to illuminate a second warning light 264B orange or another color only if the detected load reaches 9 kilograms (i.e., is within 10% of the max capacity of 10 kilograms) instead of being triggered at 8 kilograms (i.e., within the prior 20% of a max capacity of 10 kilograms).

Figure 6:
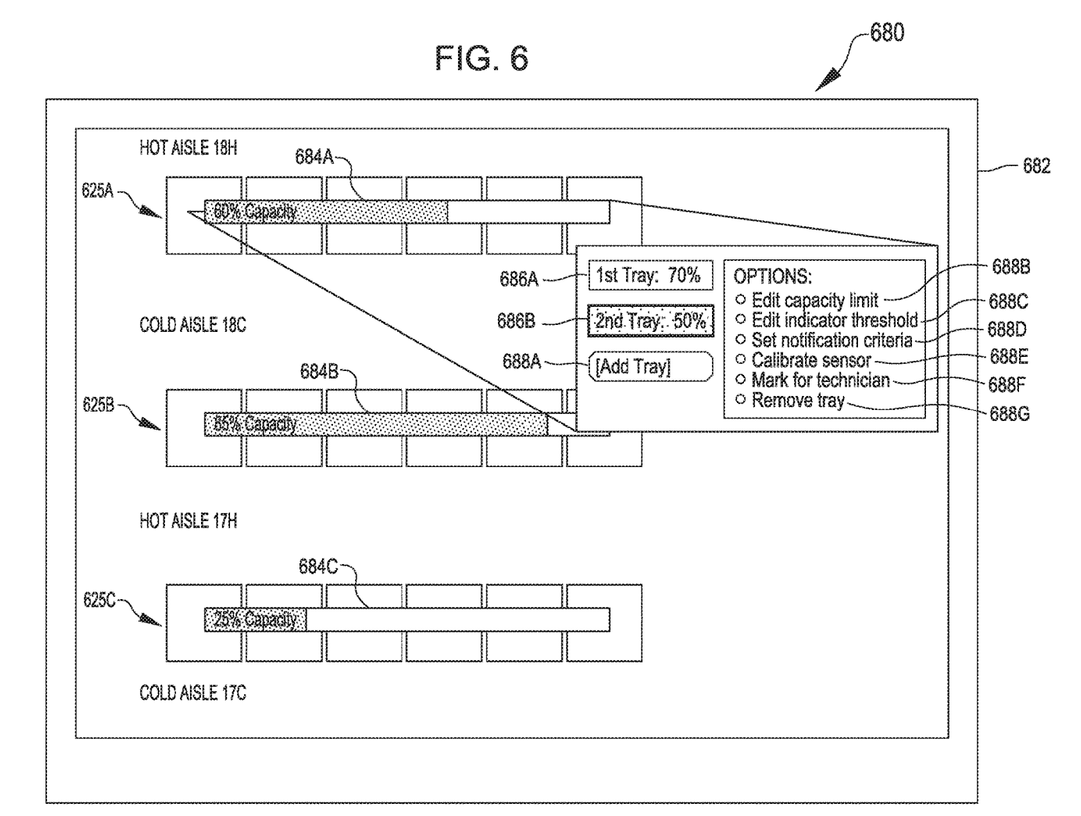
FIG. 6 illustrates a representation of an example of a user interface for the system of FIG. 5 in accordance with various embodiments.

FIG. 6 depicts a user interface 680 that may be used in systems herein. For example, the user interface 680 is shown on a screen 682, e.g., which may correspond to the screen 58C in FIG. 1. The user interface 680 may additionally or alternatively be incorporated in or interact with the communication interface module 512 or other component of the computer system 502 in FIG. 5 or otherwise be utilized to affect the system 500.

In FIG. 6, the screen 682 is displaying a row representation 625A that may be a virtual representation of a physical row 25 present in the datacenter 20, for example. The display 682 may include respective status representations 684, which may represents status indications of respective trays or sets of trays. Although the status representations 684 in FIG. 6 are shown over the row representations 625A, the status representations 684 may additionally or alternatively be positioned at least partially over spaces between row representations 625A, for example, for greater ease of viewing and/or for conformity to whatever particular arrangement of rows 25 and trays 50 may be physically present in a datacenter 20. In some examples, the status representations 684 may indicate a percentage or fraction of a capacity that is occupied or consumed by the current arrangement of cables. For example, respective amounts of 60%, 85%, and 25% utilization of capacity are shown by the status representations 684A, 684B, and 684C in FIG. 6.

In some embodiments, a status representation 684 may correspond to a set of trays. For example, in status representation 684A, the 60% capacity mark may correspond to a total or net corresponding capacity usage of a combination that includes a first tray and a second tray. For example in FIG. 6, a substatus representation 686A of a first tray is shown along with a substatus representations 686B of a second tray. Although the two trays in this illustrative example individually reflect 50% and 70% respective capacity usage, this may correspond to the two trays in the aggregate having a corresponding combined utilized capacity of 60%, e.g., indicating to a technician that additional cable can be routed in a course that is on one or the other of the trays associated with the status representation 684A or substatus representations 686A and 686B. In some embodiments, a status representation 684 that corresponds to a set of trays may be particularly suitable for a set of trays that are suspended by a shared set of rods, e.g., due to the rods experiencing a combined load that may be relevant to a capacity of a corresponding single ceiling or roof. In some embodiments, cable trays supported from the floor may be appropriately represented by status representations 684 that are indicative of individual capacities. However, any combination of combined or individual status representations 684 may be utilized without limitation to whether a set of trays has multiple trays suspended from a ceiling or supported by a floor.

The display 682 or user interface 680 may provide different options for modifying system parameters. For example at 688A, an option is provided to add a tray to the set of trays. A technician may utilize such an option to update the system to reflect a number of trays present, e.g., upon initial set up or subsequent maintenance when trays might be installed. Providing an option for adding a tray may allow flexibility for the system to be expandable, for example, to accommodate a wide variety of arrangements that may vary in a number and/or placement of trays employed.

At 688B, an option is provided to edit a capacity limit. For example, this may permit a technician to increase or decrease a capacity limit set for a tray or set of trays. A technician may utilize such an option when a tray is added or removed from a datacenter 20 or when other updated information becomes available about a capacity of a tray or associated components. Providing an option to edit capacity limits may permit refinement of the system operation to appropriately reflect age, presence, and/or other factors that may vary over the useful life of the system.

At 688C, an option is provided to edit an indicator threshold. This may correspond to changing a threshold at which an intervening indicator will illuminate or provide a notification or otherwise indicate that a threshold is being approached or has been met. For example, this may correspond to modifying operating parameters relevant to one or more of the lights 264 discussed above with respect to FIG. 3. Providing an option to edit indicator thresholds may allow the system to accommodate for changes to factors of safety or other policies according to the preferences associated with a particular installation.

At 688D, an option may be provided to set a notification criteria. For example, this may correspond to allowing the user to adjust when a notification or indicator is triggered. Providing an option to set notification criteria may facilitate efficient utilization of resources to provide a suitable amount or level of notifications to be effective in alerting a technician to associated conditions without unnecessarily expending resources for excessive notifications.

At 688E, an option is provided to calibrate a sensor. This may provide opportunity for sensors to be updated based on standardized weights or other controlled variables introduced into a particular arrangement. Providing an option to calibrate a sensor may reduce a risk of obtaining and utilizing erroneous information and permit accurate information to be obtained and utilized throughout the system.

At 688F, an option is provided for marking for a technician. For example, this may allow a technician to return to review a particular tray at a later time or to indicate that technician review is warranted to go visually inspect and/or adjust an arrangement of cables on the tray. Providing an option for marking for a technician can permit efficient use of a technician's time, for example, by reducing an amount of time a technician might otherwise expend in reviewing all trays and not just those flagged as warranting attention.

At 688G, an option is provided to remove (e.g., delete) a tray. For example, this option may be useful to reflect an infrastructure change within the datacenter. This may allow a technician to update the virtual representation of the system to match the physical system present in the datacenter and revise capacity accordingly. Providing an option to remove or delete a tray may allow flexibility for the system to be scalable, for example, to accommodate a wide variety of arrangements that may vary in a number and/or placement of trays employed.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those various embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for a datacenter, the system comprising:
a row of server racks containing servers,
a cable tray extending above and along the row of sever racks;
cables extending from the servers up into the cable tray;
a sensor coupled with the cable tray;
an indicator mounted on the cable tray; and
a controller comprising a processor and a non-transitory computer-readable medium comprising processor-executable instructions to cause the processor to:
determine a weight of the cables in the cable tray based on information from the sensor; and
cause the indicator to indicate a status of the cable tray based on the weight determined.

2. The system of claim 1, wherein the indicator comprises:
a first light configured to illuminate to indicate a load of the cable tray has reached or exceeded a capacity limit of the cable tray;
a second light configured to illuminate to indicate the load of the cable tray is within a particular threshold amount of reaching the capacity limit of the cable tray; and
a third light configured to illuminate to indicate that the load of the cable tray is below the capacity limit, that the load of the cable tray is outside the particular threshold amount of reaching the capacity limit of the cable tray, and that the cable tray has capacity to receive more cables.

3. The system of claim 2, further comprising a user interface configured to receive input to update:
the capacity limit of the cable tray; or
the particular threshold amount.

4. The system of claim 1, wherein the sensor coupled with the cable tray comprises:
a load cell assembly comprising a load cell and a plate, wherein the plate is sized and positioned to span a width of the cable tray so that the cables when routed along a length of the cable tray are supported by the plate and exert force on the load cell through the plate to provide a reading indicating the weight of the cables in the cable tray; or
a rod-based sensor associated with a rod supporting the cable tray from a ceiling, the rod-based sensor comprising:
a strain gauge coupled with the rod; or
a scale coupled with an end of the rod or coupled between parts of the rod.

5. A system, comprising:
a cable tray configured to be mounted so as to be spaced above a floor that supports a rack of datacenter components, the cable tray further configured to support cables connected to the datacenter components of the rack; and
a sensor configured to provide a reading about a load exerted by the cables on the cable tray, the sensor configured to provide the reading to another component to facilitate indicating of a status of the cable tray in response to the reading from the sensor.

6. The system of claim 5, wherein the cable tray is configured to be suspended by a rod from a ceiling, and wherein the sensor comprises a rod-based sensor configured to provide the reading about the load exerted by the cables on the cable tray based on an effect of the load on the rod.

7. The system of claim 5, wherein the sensor comprises a load-cell.

8. The system of claim 5, further comprising an indicator configured to indicate the status of the cable tray in response to the reading from the sensor.

9. The system of claim 8, wherein the indicator comprises a light configured to illuminate to indicate the status relative to a capacity of the cable tray.

10. The system of claim 8, wherein the indicator comprises a dial or a gauge.

11. The system of claim 8, wherein the indicator comprises a user interface remote from the cable tray and configured to display the status relative to a capacity of the cable tray.

12. The system of claim 11, wherein the user interface is further configured to receive input to modify parameters of a control system for controlling the indicator.

13. A system, comprising:
a first cable tray configured to support first cables connected to first datacenter components of a first rack;
a second cable tray configured to support second cables connected to second datacenter components of a second rack;
a first sensor configured to provide a first reading about a first load exerted by the first cables on the first cable tray;
a second sensor configured to provide a second reading about a second load exerted by the second cables on the second cable tray;
an indicator configured to indicate a status of at least one of the first cable tray or the second cable tray based upon at least one of the first sensor or the second sensor; and
a control system configured to receive information from the first sensor and from the second sensor and to control the indicator.

14. The system of claim 13, wherein the indicator comprises:
a first indicator configured to indicate a first status relative to a first capacity limit of the first cable tray; and
a second indicator configured to indicate a second status relative to a second capacity limit of the second cable tray.

15. The system of claim 13, wherein the control system is configured to control the indicator to indicate a status relative to a combined capacity limit of the first cable tray and the second cable tray.

16. The system of claim 13, wherein the indicator comprises a screen or display for outputting the status.

17. The system of claim 13, wherein the control system is configured to modify a capacity limit stored for at least one of the first cable tray or the second cable tray and on which the status is based.

18. The system of claim 13, wherein the control system is configured to modify a threshold at which the indicator will indicate that a capacity limit is within a certain amount of being reached.

19. The system of claim 13, wherein the control system is configured to receive a command to incorporate an additional cable tray and control the indicator to indicate a status relative to the additional cable tray based on an additional reading from an additional sensor associated with the additional cable tray.

20. The system of claim 13, wherein the control system is configured to receive a command to delete a cable tray and to control the indicator to no longer indicate a status relative to the cable tray deleted.

* * * * *